United States Patent
Gunawan (10) Patent No.: US 10,197,640 B2
(45) Date of Patent: Feb. 5, 2019

(54) CARRIER-RESOLVED MULTIPLE DIPOLE LINE MAGNET PHOTO-HALL SYSTEM

(71) Applicant: International Business Machines Corporation, Armonk, NY (US)

(72) Inventor: Oki Gunawan, Westwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/281,968

(22) Filed: Sep. 30, 2016

(65) Prior Publication Data

US 2018/0095147 A1    Apr. 5, 2018

(51) Int. Cl.
- *G01R 33/12*  (2006.01)
- *G01R 33/07*  (2006.01)
- *G01R 33/032* (2006.01)

(52) U.S. Cl.
CPC .......... *G01R 33/12* (2013.01); *G01R 33/032* (2013.01); *G01R 33/07* (2013.01)

(58) Field of Classification Search
CPC .. G01R 31/40; G01R 31/2841; G01R 31/001; G01R 31/2889; G01L 27/002
USPC .................... 324/750.01, 500, 537
See application file for complete search history.

(56) References Cited

U.S. PATENT DOCUMENTS

| | | | |
|---|---|---|---|
| 5,148,106 A | 9/1992 | Ozawa | |
| 5,793,214 A * | 8/1998 | Wakamatsu | ......... G01N 27/023 324/127 |
| 7,078,919 B2 | 7/2006 | Prussin | |
| 7,242,176 B2 * | 7/2007 | Thomason | ........... G01R 31/002 324/501 |
| 7,567,159 B2 | 7/2009 | Macken | |
| 7,952,375 B2 * | 5/2011 | Eldridge | ............ G01R 1/06711 324/754.03 |
| 8,797,058 B2 | 8/2014 | Gunawan et al. | |
| 8,895,355 B2 | 11/2014 | Cao et al. | |
| 9,041,389 B2 | 5/2015 | Gokmen et al. | |
| 9,910,053 B2 * | 3/2018 | Bakhru | .............. G01N 33/4905 |
| 2008/0143323 A1 | 6/2008 | Akahane | |

(Continued)

OTHER PUBLICATIONS

O. Gunawan et al., "A parallel dipole line system," Appl. Phys. Lett. 106, 062407-1-5 (Feb. 2015) (5 pages).

(Continued)

*Primary Examiner* — Giovanni Astacio-Oquendo (74) *Attorney, Agent, or Firm* — Vazken Alexanian; Michael J. Chang, LLC (57) ABSTRACT

The present invention provides a high-sensitivity, carrier-resolved photo-Hall and photoelectromagnet (PEM) system utilizing multiple parallel dipole line (PDL) magnet systems. In one aspect of the invention, a Hall measurement apparatus is provided. The Hall measurement apparatus includes: a measurement chamber (e.g., a cryostat); a Hall module having at least one freely-rotating cylindrical magnet within the measurement chamber; a motor-driven cylindrical magnet adjacent to the at least one freely-rotating cylindrical magnet; an optical module for photo-Hall measurement, a set of electronics instruments and a data and signal analysis program for n-th harmonics lock-in detection of magnetoresistance signal and a control program. The system yields majority carrier type, density and mobility and, with illumination, minority carrier mobility and density.

24 Claims, 9 Drawing Sheets

(56) References Cited

U.S. PATENT DOCUMENTS

2013/0342191 A1   12/2013  Gunawan
2014/0320144 A1*  10/2014  Nakaya ................. H01M 10/54
                                                                   324/434
2017/0264110 A1*   9/2017  Toya .................... H02J 7/0021

OTHER PUBLICATIONS

K.T. Mc Donald, Ph501 Electrodynamics, Problem Set 5, Princeton University, 1999 (40 pages).
A.R. Moore, "Photoelectromagnetic effect in amorphous silicon," Appl. Phys. Lett. 37(3), 327-330 (Aug. 1980).
O. Gunawan et al., "A Diamagnetic Trap with 1D Camelback Potential," arXiv preprint, arXiv:1405.5220, May 2014 (5 pages).

\* cited by examiner

CARRIER-RESOLVED MULTIPLE DIPOLE LINE MAGNET PHOTO-HALL SYSTEM

FIELD OF THE INVENTION

The present invention relates to parallel dipole line (PDL) systems, and more particularly, to a high-sensitivity and carrier resolved photo-Hall and photoelectromagnet (PEM) system utilizing multiple Dipole Line magnets, a measurement or cryostat chamber and optics system.

BACKGROUND OF THE INVENTION

Hall measurement is one of the most essential characterization techniques in electronics material device research and industry especially for semiconductor and solid state device research. A rotating parallel dipole line (PDL) high sensitivity Hall system has been developed for the characterization of very low mobility and insulating films which works based on the generation of an oscillating magnetic field and lock-in detection of the tiny Hall signal oscillation in the presence of large background noise. See, for example, U.S. Pat. No. 9,041,389 issued to Gokmen et al., entitled "Hall Measurement System with Rotary Magnet" (hereinafter "U.S. Pat. No. 9,041,389"), the contents of which are incorporated by reference as if fully set forth herein. The PDL-based system described in U.S. Pat. No. 9,041,389 is implemented using a pair of transversely magnetized magnets where each magnet produces a "dipole line" magnetic field. One of the magnets is connected to a motor and gearbox, and the other rotates freely following the motor-driven magnet through ferromagnetic coupling.

This system only yields a standard set of results in a Hall measurement, i.e., majority carrier type, density, and mobility. However, for some applications such as the development of solar cell devices, minority carrier information (e.g., mobility, density and recombination lifetime) are also important as they determine the quality of the solar cell. Thus extraction of the minority carrier information is also desired.

Furthermore, this motor and gearbox set-up limits application of the system in cases where the experimental space is confined and/or temperature-controlled. For instance, it is desirable to be able to perform similar AC field/PDL Hall measurements with a measurement or cryostat chamber for temperature-dependent studies. However, these studies would involve small sample spaces at low temperatures, also normally in a vacuum. The small sample space limits the mechanics that can be included with the system, and the low-temperature conditions affect the operation of components such as an electric motor.

Therefore, an improved alternating current (AC) field/PDL Hall system would be desirable.

SUMMARY OF THE INVENTION

The present invention provides a carrier-resolved and high-sensitivity photo-Hall and photoelectromagnet (PEM) system utilizing multiple parallel dipole line (PDL) magnet systems. In one aspect of the invention, a Hall measurement apparatus is provided. The Hall measurement apparatus includes: a measurement chamber; at least one freely-rotating cylindrical magnet within the measurement chamber; a motor-driven cylindrical magnet adjacent to the at least one freely-rotating cylindrical magnet; and a sample mounting structure configured to mount a device under test adjacent to the at least one freely-rotating cylindrical magnet.

In another aspect of the invention, a Hall measurement system is provided. The Hall measurement system includes: a Hall measurement apparatus having a measurement chamber, at least one freely-rotating cylindrical magnet within the measurement chamber, a motor-driven cylindrical magnet adjacent to the at least one freely-rotating cylindrical magnet, and a sample mounting structure configured to mount a device under test adjacent to the at least one freely-rotating cylindrical magnet; and an optical module configured to illuminate the sample mounting structure.

In yet another aspect of the invention, a method for Hall measurements is provided. The method includes: providing a Hall system including i) a Hall measurement apparatus having a measurement chamber, at least one freely-rotating cylindrical magnet within the measurement chamber, a motor-driven cylindrical magnet adjacent to the at least one freely-rotating cylindrical magnet, and a sample mounting structure, and (ii) an optical module configured to illuminate the sample mounting structure; mounting a device under test to the sample mounting structure adjacent to the at least one freely-rotating cylindrical magnet; rotating the motor-driven cylindrical magnet and the at least one freely-rotating cylindrical magnet; illuminating the device under test using the optical module; and measuring longitudinal and transverse magnetoresistance of the device under test.

A more complete understanding of the present invention, as well as further features and advantages of the present invention, will be obtained by reference to the following detailed description and drawings.

DETAILED DESCRIPTION OF PREFERRED EMBODIMENTS

Provided herein is a high-sensitivity photo-Hall and photoelectromagnet (PEM) system utilizing multiple, ferromagnetically-coupled parallel dipole line (PDL) magnets and a measurement chamber or cryostat system. Also provided herein is a magneto resistance spectral analysis technique to simultaneously extract important parameters in a semiconductor material, such as majority and minority carrier type, mobility and density, and carrier recombination lifetime. The technique relies on lock-in detection of the $1^{st}$ and $2^{nd}$ harmonic component of the magnetoresistance in pure harmonic alternating current (AC) magnetic field. The measurement can be repeated with different light intensity, light spectrum, and temperature.

Figure 1:
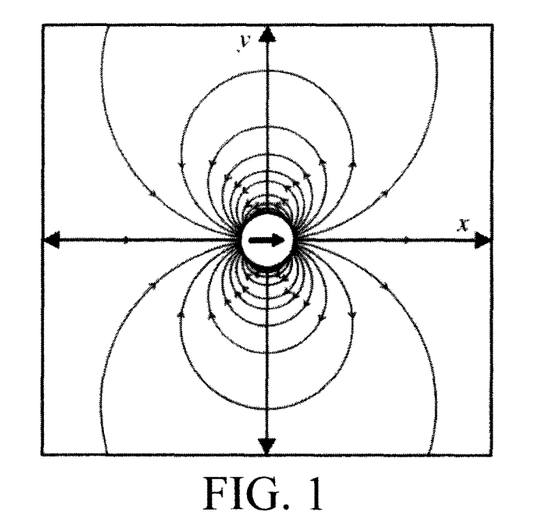
FIG. 1 is a diagram illustrating how a dipole line (DL) magnet system produces a unique magnetic field distribution forming field lines of perfect circles according to an embodiment of the present invention.

A dipole line magnet is a magnet that produces a magnetic field equal to a linear distribution of transverse dipole. The system can be realized with transversely magnetized cylindrical magnets, i.e., diametric magnets with magnetization along the magnets' diameters. See, for example, O. Gunawan et al., "A parallel dipole line system," Appl. Phys. Lett. 106, 062407-1-5 (February 2015) (5 pages) (hereinafter "Gunawan"), the contents of which are incorporated by reference as if fully set forth herein. As shown in FIG. 1, a dipole magnet system produces a unique magnetic field distribution forming field lines of perfect circles. The magnetic field B of a dipole line ($B_{DL}$) can be given as:

$$B_{DL}(x, y) = \frac{\mu_0 M a^2}{2(x^2 + y^2)^2}[(x^2 - y^2)\hat{x} + 2xy\hat{y}] \quad (1)$$

wherein M is the volume magnetization of the magnet, $\mu_0$ is the magnetic permeability in vacuum and $\alpha$ is the radius of the dipole line magnet. See, for example, K. T. Mc Donald, Ph501 Electrodynamics, Problem Set 5, Princeton University, 1999 (40 pages), the contents of which are incorporated by reference as if fully set forth herein.

Figure 2:
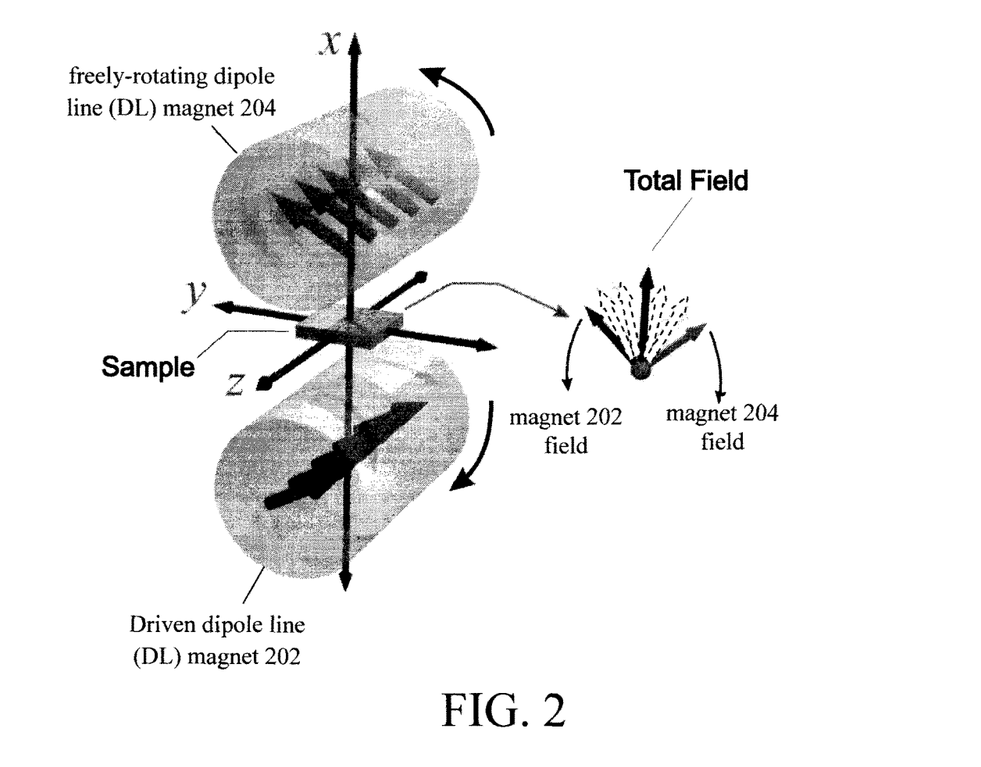
FIG. 2 is a diagram illustrating how, due to ferromagnetic coupling between two dipole lines, a rotation in one dipole line will be mirrored by the other according to an embodiment of the present invention.

A rotating Parallel Dipole Line (PDL) system can be used to produce a pure harmonic AC field. See, for example, Gunawan. As described in Gunawan, due to ferromagnetic coupling between two dipole lines, a rotation in one dipole line will be mirrored by the other. Thus, if one cylindrical dipole line magnet 202 is employed in the system that is motor-driven, and another cylindrical dipole line magnet 204 is employed in the system that rotates freely, then the second dipole line magnet 204 always mirrors the orientation of the first dipole line magnet 202. See FIG. 2. As shown in FIG. 2, the first cylindrical dipole line magnet 202 and the second cylindrical dipole line magnet 204 produce counter-rotating fields. The freely-rotating magnet can be mounted on bearings that permit it to freely rotate. See, for example, U.S. Pat. No. 9,041,389.

The total field at the center of the system is pure harmonic:

$$B_{TOT}(t) = B_0 \cos\omega t, \text{ with } B_0 = \frac{\mu_0 M a^2}{(a+g/2)}, \quad (2)$$

wherein g is the gap between the motor-driven magnet and the freely-rotating magnets and $\omega = 2\pi f$ is the angular frequency of the field and t is time. Equation 2 is accurate for $g < 2L$ where L is the length of the magnet.

Photo-Hall analysis of magnetoresistance in a pure harmonic AC magnetic field: Consider an electronic material sample (e.g., a semiconductor) with two carrier species (under light illumination), e.g., hole and electron. The longitudinal ($\rho_{xx}$) and transverse ($\rho_{xy}$) magnetoresistivity (M$\rho$, in resistivity unit) are given as:

$$\rho_{xx} = \frac{p\mu_p + \mu_n n + (p\mu_n + n\mu_p)\mu_p\mu_n B^2}{e[(n\mu_n + p\mu_p)^2 + (p-n)^2\mu_n^2\mu_p^2 B^2)]} \quad (3)$$

$$\rho_{xy} = \frac{(p\mu_p^2 - n\mu_n^2)B + (p-n)\mu_n^2\mu_p^2 B^3}{e[(n\mu_n + p\mu_p)^2 + (p-n)^2\mu_n^2\mu_p^2 B^2]}, \quad (4)$$

wherein B is the magnetic field, p and n are hole and electron carrier density, respectively, and $\mu_p$ and $\mu_n$ are hole and electron mobility, respectively.

These magnetoresistances can be expanded as:

$$\rho_{xx} = \rho_0 + \rho_2 B^2 + O(B^4) \quad (5)$$

$$\rho_{xy} = h_1 B + O(B^3) \quad (6)$$

wherein $\rho_0$, $\rho_2$ are the $0^{th}$ and $2^{nd}$ harmonic component coefficient of the longitudinal magnetoresistivity (M$\rho$), and $h_1$ is the $1^{st}$ harmonic component coefficient of the transverse magnetoresistivity or the Hall coefficient, and O(B") are terms with B" or higher. So the longitudinal and transverse M$\rho$ contain even harmonics (0, 2, 4 etc. . . . ) and odd harmonics (1, 3, . . . ), respectively. These coefficients are given below, where $\beta = \mu_n/\mu_p$ is the mobility ratio.

$$\rho_0 = \frac{1}{\beta n e \mu_p + p e \mu_p} \quad (7)$$

$$\rho_2 = \frac{\beta(1+\beta)^2 n p \mu_p}{(\beta n + p)^3 e} \quad (8)$$

$$h_1 = \frac{p - \beta^2 n}{(\beta n + p)^2 e} \quad (9)$$

To determine both majority and minority carrier properties in a sample, the first task is to determine the carrier type and density in the dark, e.g., hole density $p_0$ for P-type material. Next, some light is applied to the sample and the magnetoresistance (MR) is measured along the longitudinal ($R_{XX}$) and transverse ($R_{XY}$) direction with pure harmonic AC magnetic field.

Similar to $\rho_{xx}$ and $\rho_{xy}$, the measured MR can be expressed as:

$$R_{XX} = R_{XX,0} + R_{XX,2} \cos 2\omega t \quad (10)$$

$$R_{XY} = R_{XY,1} \cos \omega t, \quad (11)$$

where $R_{XX,0}$, $R_{XX,2}$ are the $0^{th}$ and $2^{nd}$ harmonic of the $R_{XX}$, and $R_{XY,1}$ is the $1^{st}$ harmonic of $R_{XY}$. The M$\rho$ coefficients can be calculated from these MR coefficients. In the case of a Hall bar sample where w, l, and d are the width, length, and thickness, respectively, we have:

$$\rho_0 = (R_{XX,0} - R_{XX,2})\frac{wd}{l} \quad (12)$$

$$\rho_2 = \frac{2R_{XX,2}}{B_0^2}\frac{wd}{l} - \rho_{2,BG} \quad (13)$$

$$h_1 = R_{XY,1}d/B_0, \quad (14)$$

where $\rho_{2,BG}=(\rho_2/\rho_0)_{Dark}\rho_0$ is the background 2nd harmonics due to the imperfection in the magnets that produces a small field asymmetry (e.g., one pole is stronger than the other) or the presence of background magnetoresistance in the material even in the absence of light.

Finally, one can solve for the three important parameters: hole mobility ($\mu_p$), electron mobility ($\mu_n$), and excess carrier density due to light illumination $\Delta n$ or $\Delta p$. For a P-type material we have:

$$\mu_p = \frac{h_1 - (\rho_0\rho_2 + h_1^2)\rho_0 e \pm \sqrt{4\rho_2\rho_0(1-h_1\rho_0 e) + [h_1 - \rho_0 e(\rho_0\rho_2 + h_1^2)]^2}}{2\rho_0(1-h_1\rho_0 e)} \quad (15)$$

$$\mu_n = \frac{h_1 - \rho_0\mu_p}{\rho_0(\rho_0\rho_0 e\mu_p - 1)} \quad (16)$$

$$\Delta n = \Delta p = \frac{1 - \rho_0\rho_0\mu_p e}{(\beta + 1)\rho_0\mu_p e} \quad (17)$$

For N-type material, we can swap p and n but replace the Hall coefficient $h_1$ with $-h_1$:

$$\mu_n = \frac{-h_1 - (\rho_0\rho_2 + h_1^2)n_0 e \pm \sqrt{4\rho_2\rho_0(1+h_1 n_0 e) + [h_1 + n_0 e(\rho_0\rho_2 + h_1^2)]^2}}{2\rho_0(1+h_1 n_0 e)} \quad (18)$$

$$\mu_p = \frac{h_1 + \rho_0\mu_n}{\rho_0(1 - \rho_0 n_0 e\mu_n)} \quad (19)$$

$$\Delta p = \Delta n = \frac{\beta(1 - \rho_0 n_0\mu_n e)}{(\beta + 1)\rho_0\mu_n e}. \quad (20)$$

At every light illumination, the generation rate G can be calculated by using the absorption and reflectivity of the sample and the current in Monitor Photodetector (PD, MON):

$$G = F\alpha \text{ and } F = \frac{I_{PD,MON}k_{PD}}{eQE_{REF}(\lambda)A_{REF}}(1-R-T), \quad (21)$$

wherein G is Generation rate (/m³s), F is Light flux intensity (photons/m³s), $\alpha$ is absorption coefficient (/m), R is reflectivity of the sample, T is transmission of the sample, $I_{PD,MON}$ is the Monitor Photodetector (PD,MON) current, $k_{PD}$ is the ratio of the current between the Reference PD (PD,REF) and the Monitor PD (PD,MON) (which is determined in a calibration step where a Reference PD (typically a Silicon PD) is placed on the sample position & measured simultaneously with the Monitor PD), $QE_{REF}$ is the quantum efficiency of the Reference PD, $A_{REF}$ is the area of the Reference PD, $\lambda$ is the operating wavelength, and e is the electron's charge.

Finally, given the photo-generated carrier density ($\Delta n$ and $\Delta p$) that was previously calculated, the recombination lifetime can be calculated as:

$$\tau = \Delta n/G. \quad (22)$$

Figure 3:
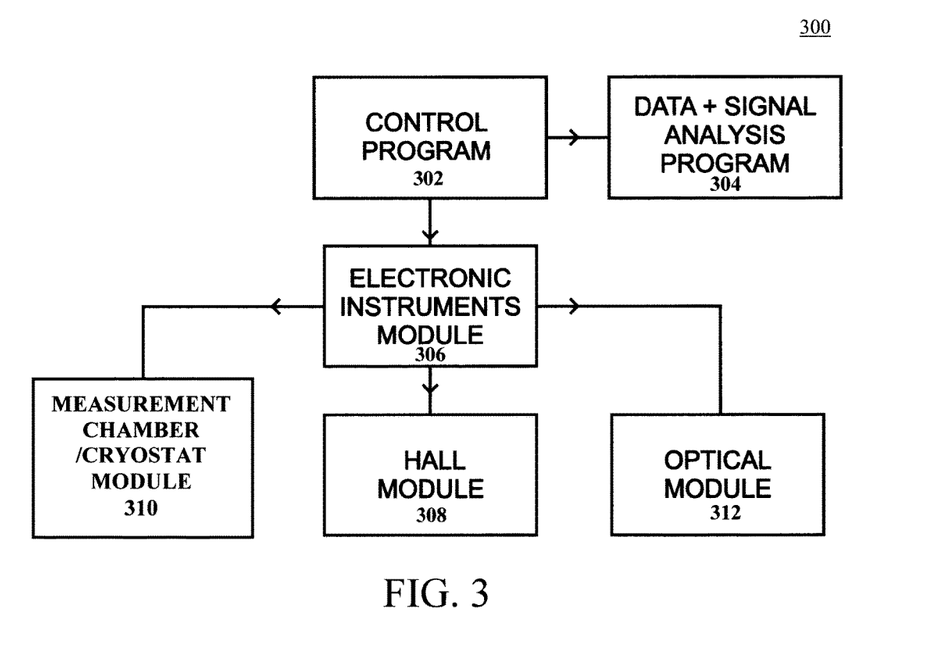
FIG. 3 is a schematic diagram illustrating an exemplary multiple dipole line magnet and Hall system according to an embodiment of the present invention.

FIG. 3 is a schematic diagram illustrating an exemplary multiple dipole line magnet photo Hall system 300 in accordance with the present techniques. As shown in FIG. 3, system 300 includes a control program 302, data and signal analysis module 304, an electronic instruments module 306, a Hall module 308, a measurement chamber or cryostat module 310, and an optical module 312.

The control program 302 controls the electronic instrument module 306 and the overall operation of the system 300 from data acquisition to data storage and reporting. For instance, the control program interacts with a user, takes input for sample information, and controls the data and signal analysis module 304, the electronics instruments module 306, Hall module 308, measurement chamber or cryostat module 310, and optical module 312. The data and signal analysis program 304 performs signal processing and calculation, such as Fourier spectral analysis and n-th harmonic lock-in detection. For instance, the data and signal analysis program 304 generates, pre-processes and visualizes Fourier spectra or Power Spectral Density of the longitudinal or transverse magnetoresistance (MR) and performs lock-in detection of the n-th (e.g., first and second) harmonics of these MR signals, calculates the results such as majority carrier type, carrier density and mobility and minority carrier mobility and density under light illumination (see Equations 15-20, below), and generates reports and plots of the results.

The electronic instruments module 306 contains a set of electronics sub-modules to perform source and measure operation, switch matrix and buffering, motor control, field sensing and cryostat temperature control. The Hall module 308 contains a set of motor driven and (multiple) freely rotating dipole line magnets, a field sensor, a sample stage, and electrical interconnects.

In its basic form, module 310 is simply a measurement chamber (i.e., an enclosed (vacuum) chamber in which sample measurements are made). However, in an exemplary embodiment, the measurement chamber has a special capability where temperature can be controlled. Thus, in that example, the measurement chamber is a cryostat. When configured as a cryostat, the measurement chamber or cryostat module 310 contains a vacuum chamber, a cold stage, a refrigerator engine, and control electronics. The optical module 312 contains a system to provide illumination to the sample, such as a monochromatic or broadband light source, a continuous neutral density filter, a shutter, photodetectors, a beam splitter, a reflectivity sub module (integrating sphere+photodetector) and an absorption sub module.

A detailed description of each component of the dipole line magnet and Hall system 300 is now provided. For instance, FIG. 4 is a diagram illustrating an exemplary configuration 400 of the Hall module 308, measurement chamber or cryostat module 310, and optical module 312.

Figure 4:
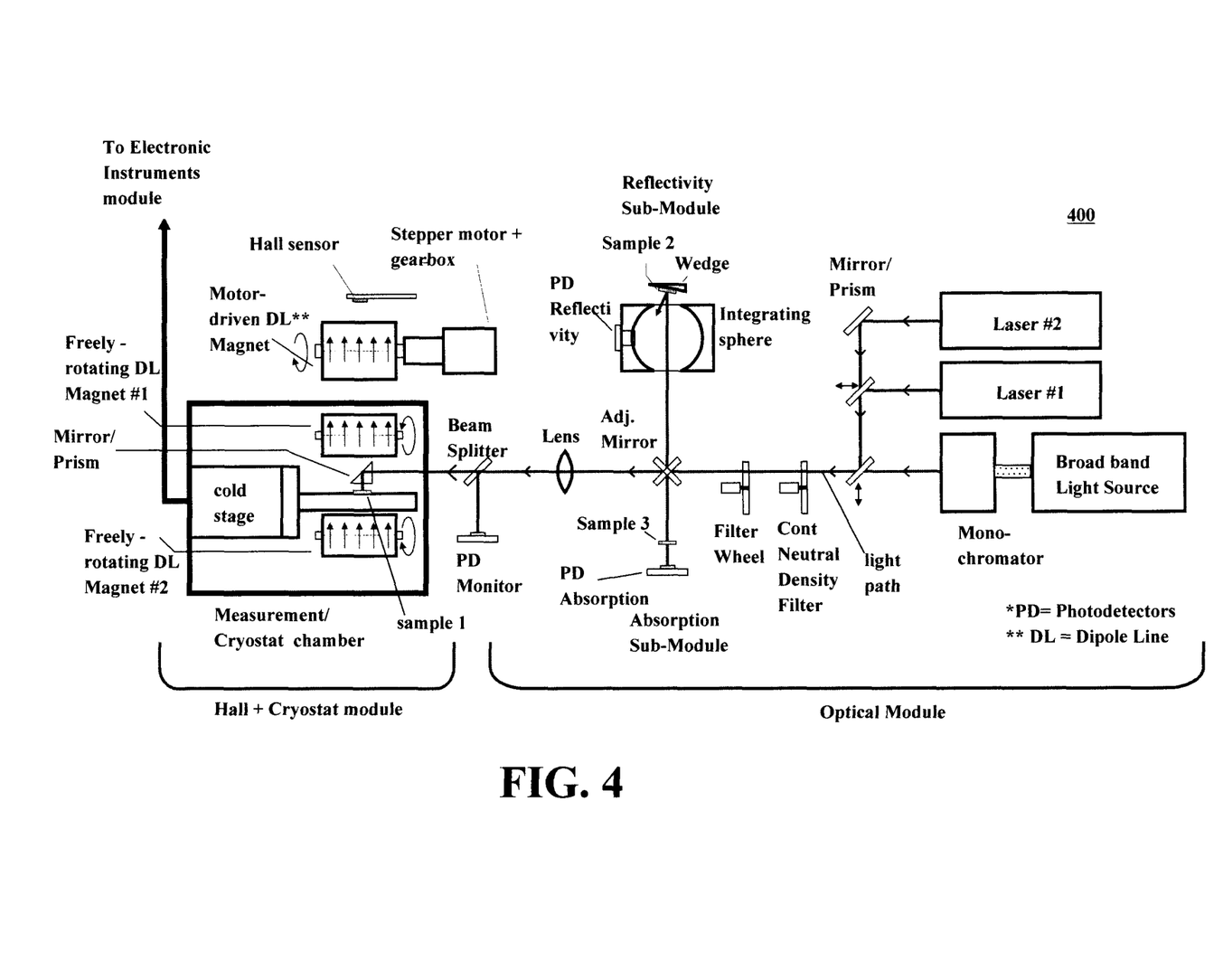
FIG. 4 is a diagram illustrating an exemplary configuration of the Hall, measurement or cryostat chamber, and optical modules according to an embodiment of the present invention.

In the example shown in FIG. 4, the Hall module 308/cryostat module 310 includes one dipole line (DL) magnet (Motor-driven DL magnet) driven by stepper motor and gearbox. As highlighted above, the "dipole line" (or diametric) magnets are cylindrical magnets with uniform transverse magnetization whose poles (north or south pole) are on opposite sides of the curved surface as illustrated in FIGS. 1 and 2, described above. A Hall sensor is positioned adjacent to the Motor-driven DL magnet to monitor the phase or rotation speed of the magnets. A Hall sensor or Hall effect sensor is a device that varies its output voltage in response to a magnetic field (in this case that of the motor-driven DL magnet). Hall sensors are commonly used for a variety of applications including speed detection.

At least one first freely rotating DL magnet is located within a measurement or cryostat chamber. The first freely rotating DL magnet is positioned within a region of the chamber proximal to the motor-driven DL magnet. See FIG. 4. For instance, in the example shown in FIG. 4, the motor-driven DL magnet is adjacent to a top side of the chamber. Thus, the first freely rotating DL magnet is present within the chamber, proximal to the top side of the chamber. Advantageously, this configuration permits the motor-driven DL magnet and its associated hardware (stepper motor, gearbox, etc.) to be placed outside of the chamber. Thus, saving space within the chamber, and preventing exposure of the motor and other hardware to the low temperature environment within the chamber.

Optionally, at least one second freely rotating DL magnet may also be included in the chamber. See FIG. 4. The second freely rotating DL magnet serves to improve the field strength on the sample (see, for example, U.S. Pat. No. 9,041,389), however the required torque needed for rotation is larger when multiple magnets are employed. As shown in FIG. 4, when present, the second freely rotating DL magnet is located within the chamber opposite the first freely rotating DL magnet (with the sample, etc. positioned therebetween) and distal from the motor-driven DL magnet. For instance, in the example shown in FIG. 4, the motor-driven DL magnet is adjacent to a top side of the chamber, and the second freely rotating DL magnet is located distal from the top side of the chamber (i.e., adjacent to the bottom side of the chamber). As also shown in FIG. 4, the direction of rotation of the motor-driven DL magnet is opposite to that of the first freely rotating DL magnet and, when present, the same as that of the second freely rotating DL magnet. As this indicates, the rotation of the first freely rotating DL magnet is based on the rotation of the motor-driven DL magnet, while the rotation of the second freely rotating DL magnet is based on the rotation of the first freely rotating DL magnet.

A cold stage is used to regulate the temperature of the sample. As shown in FIG. 4, the cold stage (and hence temperature within the chamber) is regulated by the electronic instruments module 306. A sample stage (mirror/prism+sample) allows analysis of a Hall sample (sample 1) perpendicular to the magnetic field for photo-Hall or parallel with the magnetic field for Photo-Electro-Magnet (PEM) measurement. See, for example, A. R. Moore, "Photoelectromagnetic effect in amorphous silicon," Appl. Phys. Lett. 37(3), 327-330 (August 1980), the contents of which are incorporated by reference as if fully set forth herein. Specifically, the sample stage permits the sample to be mounted in one of two orientations: perpendicular or parallel relative to the total magnetic field. When the sample is mounted perpendicular to the total magnetic field (e.g., sample is on the y-z plane in FIG. 2), Hall measurements can be made. When the sample is mounted parallel to the total magnetic field (e.g., sample is on the x-z plane in FIG. 2), PEM measurements can be made. A different sample mount is needed to mount the sample in these two orientations.

Figure 5:
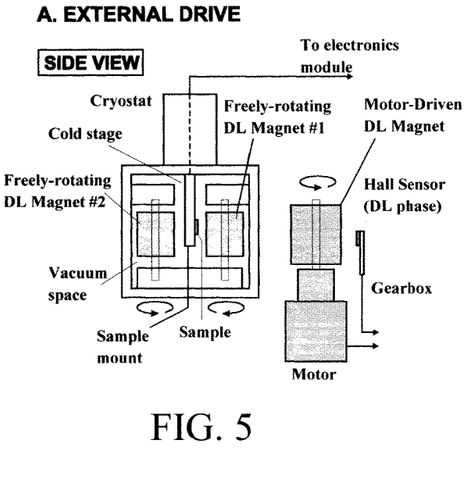
FIG. 5 is a side view diagram illustrating an external drive system according to an embodiment of the present invention.
Figure 6:
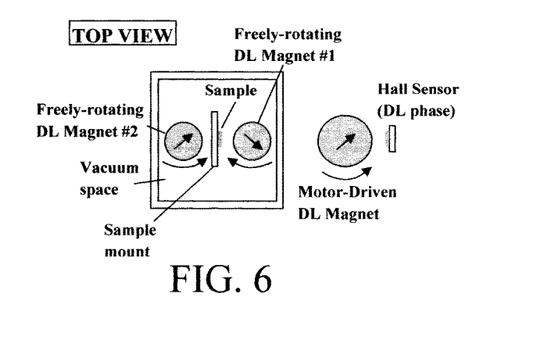
FIG. 6 is a top view diagram illustrating the external drive system according to an embodiment of the present invention.

A number of different configurations of the Hall module 308/cryostat module 310 design are envisioned herein. FIG. 5 (side view) and FIG. 6 (top view) illustrate the external drive system employed in FIG. 4. Specifically, with the external drive, a motor-driven DL magnet outside of the cryostat chamber drives two freely-rotating DL magnets (i.e., freely-rotating DL magnet #1 and freely-rotating DL magnet #2) that are located within the cryostat chamber. The Hall sensor detects the phase of the motor-driven DL magnet.

Figure 7:
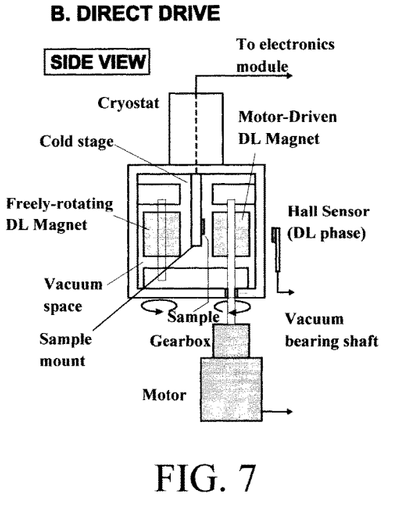
FIG. 7 is a side view diagram illustrating an alternative embodiment employing a direct drive system according to an embodiment of the present invention.

In an alternative embodiment shown illustrated in FIG. 7, a direct drive system is employed wherein a motor and gearbox shaft directly drives the magnet (within the cryostat chamber) closer to the sample. The motor can be placed inside or, as shown in FIG. 7, outside of the vacuum chamber. In some cryostat systems, the vacuum chamber space is limited, so the motor has to be placed outside of the chamber, however a vacuum compatible drive shaft is needed. By "vacuum compatible" it is meant that the drive shaft extends from the inside to the outside of the chamber, and spins freely without causing any breaks in the vacuum seal.

Figure 8:
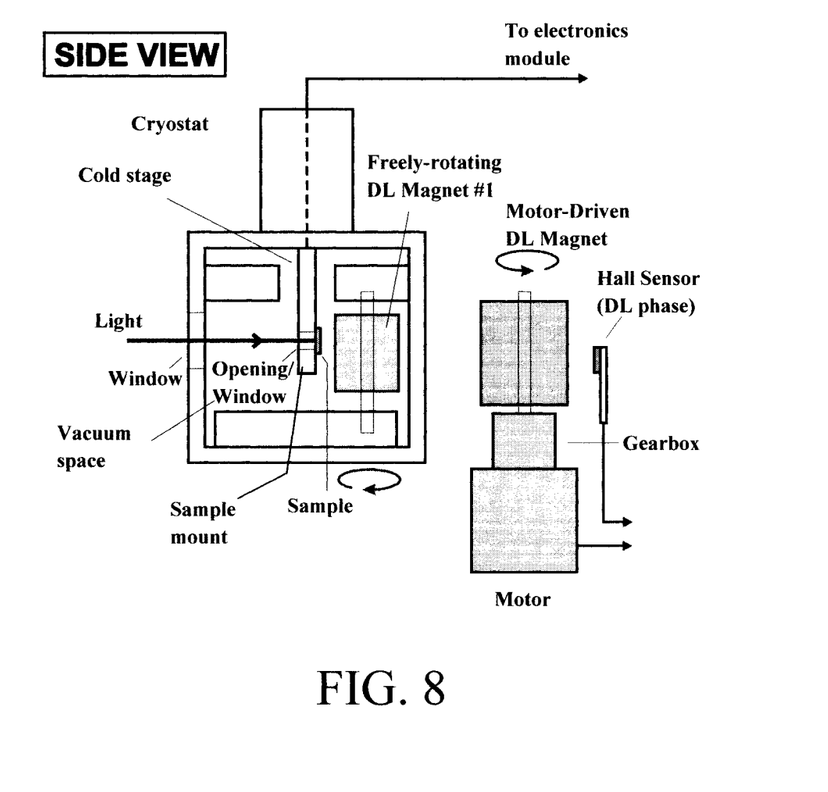
FIG. 8 is a side view diagram illustrating an alternative embodiment employing only one freely-rotating DL magnet within the measurement or cryostat chamber which enables direct illumination of the sample according to an embodiment of the present invention.

In yet another alternative embodiment, one of the two freely-rotating DL magnets within the cryostat chamber is removed. See, for example, FIG. 8. Removing one of the freely-rotating magnets provides several notable benefits. First, as shown in FIG. 8, this configuration enables direct light illumination from a rear side of the sample. Specifically, an opening or window is provided both in the cryostat chamber wall and the sample mounting structure that are in line of sight of the rear side of the sample. See FIG. 8. Thus, light passing through these windows will be incident on the rear side of the sample. Second, without the need for a prism or mirror (since there is direct illumination) the freely-rotating DL magnet can be placed closer to the sample for a higher field. Third, as highlighted above, multiple freely-rotating DL magnets means that more torque is needed for rotation. With one less magnet, the torque requirement becomes less, and hence the motion becomes smoother. It is notable that one of the freely-rotating DL magnets can be removed for direct illumination of the sample in conjunction with the external drive (FIGS. 5 and 6) and/or with the direct drive (FIG. 7) configurations.

Referring back to FIG. 4, the optical module 312 is optically connected to the Hall module 308/measurement chamber or cryostat module 310, i.e., such that light produced by the optical module 312 illuminates the sample mounting structure/sample within the Hall module 308/cryostat module 310. As shown in FIG. 4, the optical module 312 includes multiple light sources (see, for example, Laser #1, Laser #2, Broad band Light Source, etc.). For instance, lasers of various wavelengths and/or broad band light source+monochromator (to isolate a narrow band of wavelengths of the light) are suitable light sources. As shown in FIG. 4, the light from the light sources can be switched and/or multiplexed electrically or using a set of mirrors or prisms.

A continuous neutral density filter is present in the light path (i.e., between the light source and the sample) to control the light intensity. A suitable continuous neutral density filter design is described, for example, in U.S. Pat. No. 8,797,058 issued to Gunawan et al., entitled "Solar Cell Characterization System with an Automated Continuous Neutral Density Filter," the contents of which are incorporated by reference as if fully set forth herein. Additional filters, such as bandpass filters, can be added via a filter wheel. See FIG. 4.

Following along the light path to the sample (sample 1), a lens is used to expand the beam to cover a large sample area (e.g., 5 millimeters (mm)×5 mm, and a beam splitter is used to split the light source beam i) to the sample and ii) to a monitor photodetector (PD). The monitor photodetector measures, for example, the intensity of the light passing through the filter wheel (to the sample). A mirror or prism (mirror/prism) within the cryostat chamber directs the light beam to a surface of the Hall sample (sample 1).

In the example shown in FIG. 4, a reflectivity sub-module and an absorption sub-module are located orthogonal to the light path. An adjustable mirror (Adj. mirror) is used to divert the light path towards either of these sub-modules. As shown in FIG. 4, the reflectivity sub-module includes an integrating sphere (i.e., a hollow spherical cavity having an interior coated with a reflective coating), a reflectivity photodetector (PD reflectivity), and a wedge stage to position the sample (sample 2) at an inclined angle. The absorption sub-module includes a sample (sample 3) holder and a photodetector (PD absorption). The reflectivity sub-module and an absorption sub-module are used to measure the samples' reflectivity and absorption, respectively. Thus, while the samples are labeled as sample 1, sample 2, and sample 3 in FIG. 4, this is done solely for clarity of description and, in practice, these are samples of the same material.

Figure 9:
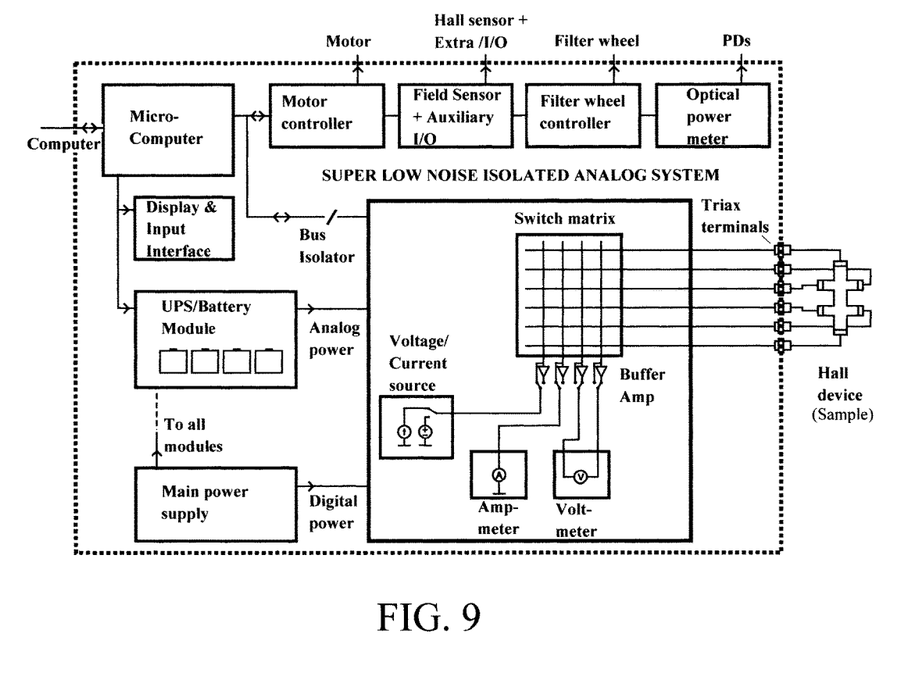
FIG. 9 is a diagram illustrating an exemplary configuration of the electronic instrument module according to an embodiment of the present invention.

FIG. 9 is a diagram illustrating an exemplary configuration of the electronic instrument module 306. As shown in FIG. 9, the electronic instrument module 306 includes a microcomputer to control all hardware modules and to communicate with the host computer (control program 302), and a super low noise isolated analog system for Source and Measure functions.

Specifically, as shown in FIG. 9, the super low noise isolated analog system includes a switch matrix system with buffer amplifiers (Buffer Amp) to connect terminals of the Hall device (which is the device being tested, i.e., the device under test) to the source and measure units which include a voltage and current source, an amp-meter for measuring current through the sample or Hall device, and a voltmeter to measure voltage across a pair of selected terminals of the Hall device. The voltmeter can be made of a high precision Analog Digital Converter (ADC) chip such as a 24- to 32-bit ADC with one or two channels for simultaneous measurement of MR signals (e.g., $R_{XY}$ and $R_{XX}$). The switch matrix has at least 6 sample input terminals, 2 terminals for voltage/current source, and 2 terminals for voltage or magnetoresistance (MR) measurement. The super low noise isolated analog system communicates via an isolated bus interface with the microcomputer.

A display and input interface is included for user control of the system. An uninterruptible power supply (UPS)/battery pack module supplies clean or low noise power to the isolated analog system. A motor controller controls the motor which drives the (motor-driven) magnet.

A field sensor module senses the (motor-driven) magnet position from the Hall sensor. Auxiliary Input/Outputs (I/O) are also provided for various additional functions such as extra analog outputs, digital I/Os, and relays. For instance, an analog output may be used to drive device gate voltages, a relay may be used to select laser lines or for laser safety interlocks, etc.

A filter wheel controller controls the filter for light intensity or to totally block the light (i.e., a shutter function). An optical power meter or auto ranging ampmeter with wide scales range (1 pA to 100 mA) is used to measure the light intensity of various photodetectors (PDs) in the optical module 312. A power supply (Main Power Supply) powers everything else except the isolated analog system.

Figure 10:
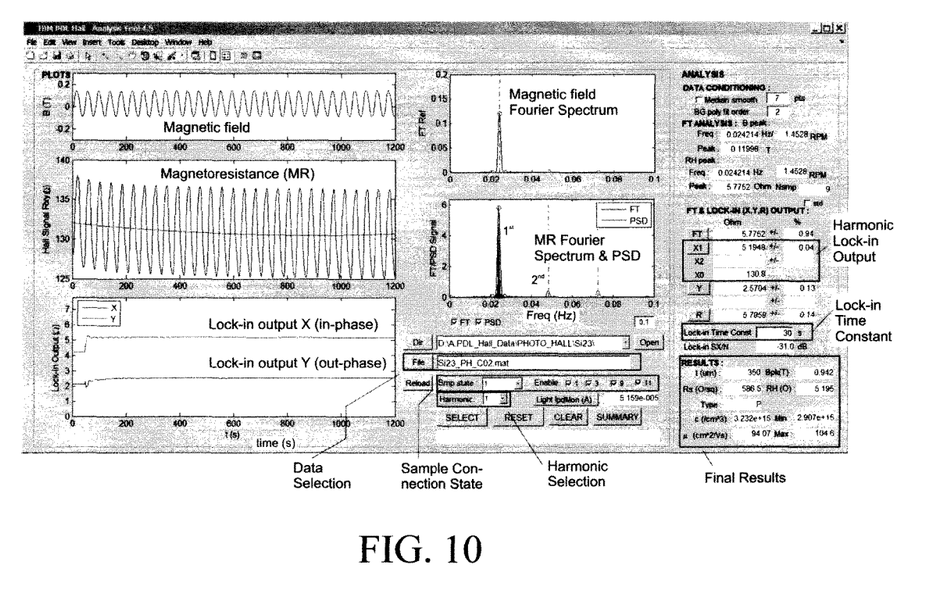
FIG. 10 is a diagram illustrating an exemplary configuration of the data and signal analysis module according to an embodiment of the present invention.

FIG. 10 is a diagram illustrating an exemplary configuration of the data and signal analysis module 304. After measurement of the device under test has been performed (see, for example, FIG. 11—described below), the resulting data is loaded into the data and signal analysis module 304. According to an exemplary embodiment, the data relates to at least one of the following device parameters: contact resistance test ($R_{CT}$), sheet or longitudinal resistance ($R_S$), and magnetoresistance (MR) sweep measured according to methodology 1100 of FIG. 11.

As shown in FIG. 10, the data and signal analysis module 304 displays the MR data and permits selection of a MR data set that corresponds to certain sample connection, e.g., longitudinal ($R_{XX}$) or transverse ($R_{XY}$). In order to process the MR signal, polynomial background subtraction or median averaging is applied to remove background and noise. The user can select the harmonic content to analyze e.g., $R_{XY,1}$ and $R_{XX,2}$. The Fourier spectra are displayed for inspection. A lock-in detection can be performed on the desired harmonic based on the oscillating magnetic field as the reference signal frequency and phase. The lock-in time constant is changed accordingly typically 2 to 5 periods for integration. A good result typically has prominent Fourier spectrum peak and steady lock-in output over time.

The MR harmonic components ($R_{XY,1}$ and $R_{XX,2}$) are extracted from lock-in detection and $R_{XX-0}$ from the average of $R_{XX}$ which is the $0^{th}$ harmonic term of $R_{XX}$. Afterwards, the final results are calculated: majority carrier type, mobility and density for dark Hall measurement; and majority and minority carrier mobility and photo-generated carrier density at the given light intensity.

Figure 11:
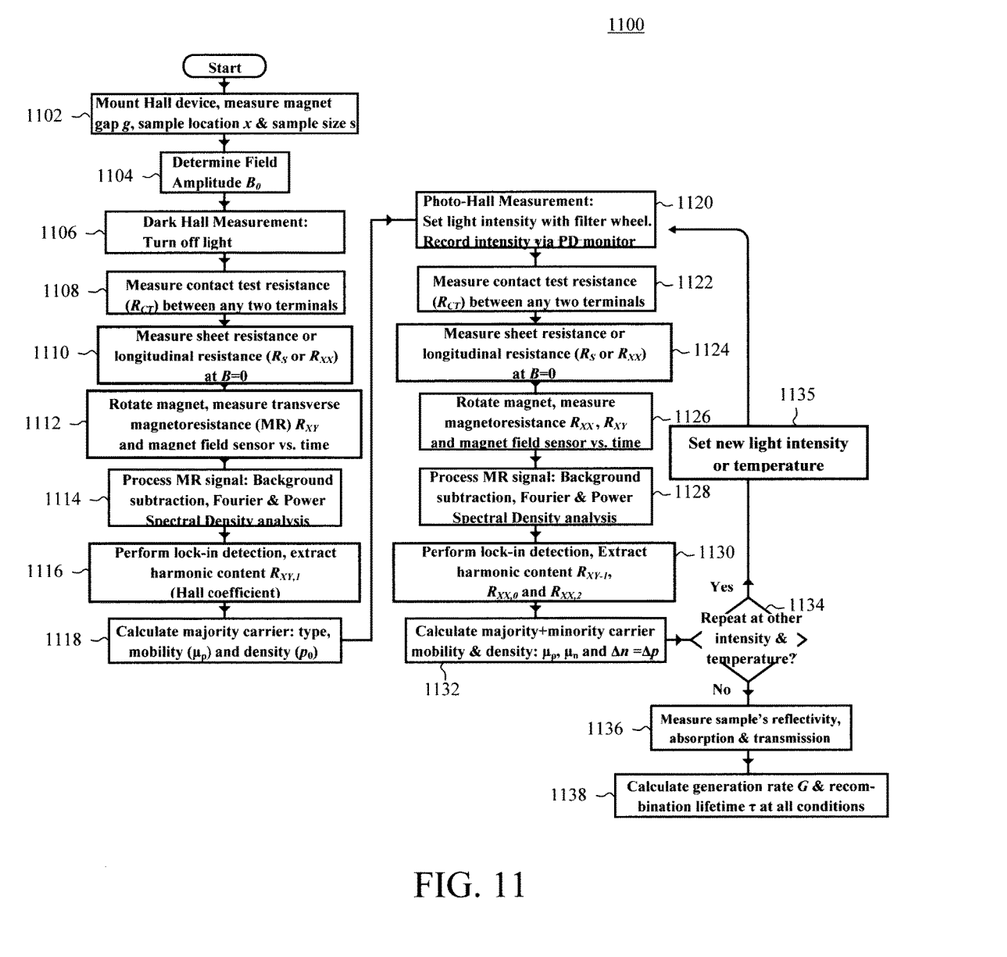
FIG. 11 is a diagram illustrating an exemplary methodology for Hall measurement according to an embodiment of the present invention.

An exemplary methodology 1100 for Hall measurement of a semiconductor Hall device under test using the present system is now described by way of reference to FIG. 11. According to an exemplary embodiment, the device under test (i.e., the sample) has at least 4 terminals for voltage/current sourcing and voltage or magnetoresistance measurement. By way of example only, the sample can be a 4 terminal Van der Pauw device or 6 terminal Hall Bar. As described above, the same sample can be measured in the Hall module and in the reflectivity & absorption sub-module.

The measurement process generally includes three stages: contact test resistance measurement ($R_{CT}$) to test any two terminals in the device, sheet resistance ($R_S$) or longitudinal resistance measurement at zero magnetic field (i.e., B=0), and magnetoresistance (MR) measurement on both longitudinal and transverse direction ($R_{XX}$ and $R_{XY}$) with oscillating field or rotating PDL magnets.

Specifically, referring to methodology 1100, in step 1102 the device under test is mounted to the sample mounting structure and several initial parameters are measured such as the gap g between the magnets that sandwich the sample, the sample offset location along the x-axis (see FIG. 2), and the sample size. From these initial parameters, the average maximum field over the sample which is also the field oscillation amplitude $B_0$ can be determined in step 1104. $B_0$ can be determined using the equation of a magnetic field of a dipole line or diametric magnet. For a sample on the plane y-z (see FIG. 2) at the center of the gap g, the field is given as:

$$B_{PDL}(y,z) = \frac{\mu_0 M a}{2\pi} \int_0^{2\pi} \sum_{n=1,2} \frac{(-1)^n (g/2 - a\cos\phi)\cos\phi}{u_n^2 + v^2 + u_n\sqrt{u_n^2 + v^2}} d\phi \hat{x} \quad (23)$$

$$v^2 = (g/2 - a\cos\phi)^2 + (y - a\sin\phi)^2$$

$$u_{1,2} = z \pm L/2.$$

The field oscillation amplitude $B_0$ can be obtained by averaging this maximum field across the sample area. For example, for a sample with size s×s: $B_0 = \int B_{PDL}(y,z)dy\, dz/s^2$.

An exemplary characterization run is described in FIG. 11: First the Dark Hall measurement is performed to obtain the majority carrier type, density and mobility (using Equations 15-20, above), in step 1106 the light source (from the optical module 312) is turned off, and in steps 1108 and 1110 the contact test resistance ($R_{CT}$) between any two terminals in the device and the sheet resistance ($R_S$) (or longitudinal resistance at zero magnetic field, i.e., B=0) are measured, respectively.

Next, the MR sweep is performed. In step 1112 the magnets of the present system are rotated (as described above), and the transverse MR ($R_{XY}$) is measured as a function of time.

The data & signal processing program is used to generate the Fourier spectra of $R_{XY}$ (step 1114) and extract the harmonic content $R_{XY-1}$ via lock-in detection (step 1116). Then in step 1118 the majority carrier type, density and mobility are calculated using standard Hall equations. The extraction of the n-th harmonics signal is done by performing lock-in detection based on n-times the frequency of the reference magnetic field oscillation.

Next, Photo-Hall measurements are made where we apply light illumination (step 1120) and repeat the above steps to measure the contact test resistance ($R_{CT}$) between any two terminals in the device and the sheet resistance ($R_S$) (or longitudinal resistance at zero magnetic field i.e., B=0), in steps 1122 and 1124, respectively. However, at least two MR sweeps are performed for the longitudinal and transverse direction ($R_{XX}$ and $R_{XY}$) in step 1126. As above, the data & signal processing program is used to generate the Fourier spectra of $R_{XY}$ (step 1128) and extract the harmonic content $R_{XY-1}$ via lock-in detection (step 1130).

The majority and minority carrier mobility and density are then calculated (using Equations 15-20, above) in step 1132. As per step 1134, this photo-Hall measurement can be repeated at various light intensities and temperatures by controlling the cryostat or the light filter wheel at step 1135.

Given the excess or minority carrier density ($\Delta p$ or $\Delta n$) from the photo-Hall measurement, recombination lifetime of the carriers can be calculated (using Equations 21 and 22, above) in step 1138. The generation rate (G) is calculated by measuring the light flux intensity, absorption, reflection and transmission coefficient of the sample at the operating wavelength, as per step 1136.

Figure 12:
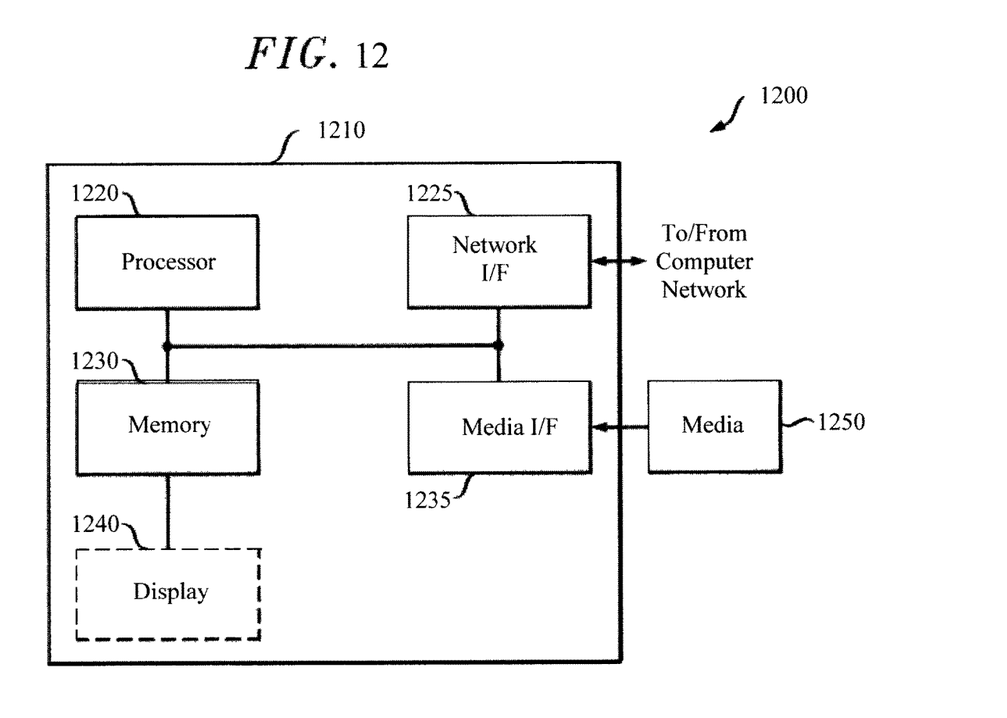
FIG. 12 is a diagram illustrating an exemplary apparatus for performing one or more of the methodologies presented herein according to an embodiment of the present invention.

Turning now to FIG. 12, a block diagram is shown of an apparatus 1200 for implementing one or more of the methodologies presented herein. By way of example only, apparatus 1200 can be configured to implement one or more of the steps of methodology 1100 of FIG. 11, and may embody one or more of the modules in system 300 of FIG. 3.

Apparatus 1200 includes a computer system 1210 and removable media 1250. Computer system 1210 includes a processor device 1220, a network interface 1225, a memory 1230, a media interface 1235 and an optional display 1240. Network interface 1225 allows computer system 1210 to connect to a network, while media interface 1235 allows computer system 1210 to interact with media, such as a hard drive or removable media 1250.

Processor device 1220 can be configured to implement the methods, steps, and functions disclosed herein. The memory 1230 could be distributed or local and the processor device 1220 could be distributed or singular. The memory 1230 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1220. With this definition, information on a network, accessible through network interface 1225, is still within memory 1230 because the processor device 1220 can retrieve the information from the network. It should be noted that each distributed processor that makes up processor device 1220 generally contains its own addressable memory space. It should also be noted that some or all of computer system 1210 can be incorporated into an application-specific or general-use integrated circuit.

Optional display 1240 is any type of display suitable for interacting with a human user of apparatus 1200. Generally, display 1240 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A Hall measurement apparatus, comprising:
   a measurement chamber;
   at least one freely-rotating cylindrical magnet within the measurement chamber;
   a motor-driven cylindrical magnet adjacent to the at least one freely-rotating cylindrical magnet; and
   a sample mounting structure configured to mount a device under test adjacent to the at least one freely-rotating cylindrical magnet.

2. The Hall measurement apparatus, wherein the measurement chamber comprises a cryostat.

3. The Hall measurement apparatus of claim 1, further comprising:
   a motor; and
   a drive shaft connecting the motor to the motor-driven cylindrical magnet.

4. The Hall measurement apparatus of claim 3, wherein the motor is outside of the measurement chamber.

5. The Hall measurement apparatus of claim 4, wherein the motor-driven cylindrical magnet is outside the measurement chamber.

6. The Hall measurement apparatus of claim 4, wherein the motor-driven cylindrical magnet is inside the measurement chamber.

7. The Hall measurement apparatus of claim 6, wherein the drive shaft is connected to the motor-driven cylindrical magnet inside the cryostat chamber and to the motor outside the measurement chamber.

8. The Hall measurement apparatus of claim 1, wherein the measurement chamber and the sample mounting structure each comprise windows therein.

9. The Hall measurement apparatus of claim 1, comprising at least one first freely-rotating cylindrical magnet and at least one second freely-rotating cylindrical magnet within the measurement chamber.

10. The Hall measurement apparatus of claim 9, wherein the sample mounting structure is present in between the at least one first freely-rotating cylindrical magnet and the at least one second freely-rotating cylindrical magnet.

11. A Hall measurement system, comprising:
   a Hall measurement apparatus having a measurement chamber, at least one freely-rotating cylindrical magnet within the measurement chamber, a motor-driven cylindrical magnet adjacent to the at least one freely-rotating cylindrical magnet, and a sample mounting structure configured to mount a device under test adjacent to the at least one freely-rotating cylindrical magnet; and an optical module configured to illuminate the sample mounting structure.

12. The Hall measurement system of claim 11, wherein the measurement chamber comprises a cryostat.

13. The Hall measurement system of claim 11, wherein the optical module further comprises:

at least one light source configured to generate light that travels along a light path to the sample mounting structure.

14. The Hall measurement system of claim 13, wherein the at least one light source is selected from the group consisting of: a laser, a broad band light source, and combinations thereof.

15. The Hall measurement system of claim 13, further comprising:

a continuous neutral density filter along the light path between the at least one light source and the sample mounting structure.

16. The Hall measurement system of claim 13, further comprising:

a photodetector for monitoring an intensity of the light illuminating the sample mounting structure; and a beam splitter along the light path between the at least one light source and the sample mounting structure configured to split the light to the sample mounting structure and to the photodetector.

17. The Hall measurement system of claim 13, further comprising:

a reflectivity sub-module for measuring a reflectivity of a sample; and an absorption sub-module for measuring an absorption of the sample.

18. The Hall measurement system of claim 17, wherein the reflectivity sub-module and the absorption sub-module are located within the optical module orthogonal to the light path, and wherein the Hall measurement system further comprises:

a mirror along the light path between the at least one light source and the sample mounting structure configured to divert the light path toward either the reflectivity sub-module or the absorption sub-module.

19. The Hall measurement system of claim 11, further comprising:

an electronics instrument module comprising a switch matrix system with buffer amplifiers to connect terminals of the device under test to source and measure units, wherein the source and measure units comprise: a voltage and current source, an amp-meter for measuring current through the device under test, and a voltmeter to measure voltage across a pair of selected terminals of the device under test.

20. The Hall measurement system of claim 19, wherein the voltmeter comprises an analog to digital converter.

21. The Hall measurement system of claim 19, further comprising:

a data and signal analysis module for processing data from the device under test; and a control program for controlling the Hall measurement system, the optical module, the electronics instrument module, and the data and signal analysis module.

22. A method for Hall measurements, the method comprising:

providing a Hall system comprising i) a Hall measurement apparatus having a measurement chamber, at least one freely-rotating cylindrical magnet within the measurement chamber, a motor-driven cylindrical magnet adjacent to the at least one freely-rotating cylindrical magnet, and a sample mounting structure, and (ii) an optical module configured to illuminate the sample mounting structure;

mounting a device under test to the sample mounting structure adjacent to the at least one freely-rotating cylindrical magnet;

rotating the motor-driven cylindrical magnet and the at least one freely-rotating cylindrical magnet;

illuminating the device under test using the optical module; and measuring longitudinal and transverse magnetoresistance of the device under test.

23. The method of claim 22, wherein the Hall system further comprises iii) a data and signal analysis module, the method further comprising:

generating a Fourier spectra of the longitudinal and transverse magnetoresistance of the device under test using the data and signal analysis module; and performing n-th harmonics lock-in detection of the longitudinal and transverse magnetoresistance of the device under test.

24. The method of claim 23, further comprising:

calculating majority and minority carrier densities and mobilities using the data and signal analysis module from an n-th harmonic component of the longitudinal and transverse magnetoresistance of the device under test.

* * * * *